(12) United States Patent
Harper et al.

(10) Patent No.: US 6,659,512 B1
(45) Date of Patent: Dec. 9, 2003

(54) INTEGRATED CIRCUIT PACKAGE EMPLOYING FLIP-CHIP TECHNOLOGY AND METHOD OF ASSEMBLY

(75) Inventors: Timothy V. Harper, Boise, ID (US); Greg L. Allen, Boise, ID (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/199,441

(22) Filed: Jul. 18, 2002

(51) Int. Cl.[7] .................................................. H01L 29/40
(52) U.S. Cl. ...................................... 287/777; 257/786
(58) Field of Search ................................. 257/777, 778, 257/723, 786; 438/125

(56) References Cited

U.S. PATENT DOCUMENTS

| | | | |
|---|---|---|---|
| 5,564,617 A | | 10/1996 | Degani et al. |
| 5,671,530 A | | 9/1997 | Combs et al. |
| 5,723,369 A | | 3/1998 | Barber |
| 5,760,478 A | * | 6/1998 | Bozso et al. ................ 257/777 |
| 5,790,384 A | * | 8/1998 | Ahmad et al. ............... 361/760 |
| 5,798,567 A | * | 8/1998 | Kelly et al. ................. 257/723 |
| 5,801,072 A | | 9/1998 | Barber |
| 5,804,882 A | * | 9/1998 | Tsukagoshi et al. ........ 257/783 |
| 6,084,308 A | * | 7/2000 | Kelkar et al. ............... 257/777 |
| 6,098,278 A | | 8/2000 | Vindasius et al. |
| 6,150,724 A | * | 11/2000 | Wenzel et al. .............. 257/777 |
| 6,189,208 B1 | | 2/2001 | Estes et al. |
| 6,190,940 B1 | | 2/2001 | DeFelice et al. |
| 6,201,301 B1 | | 3/2001 | Hoang |
| 6,225,699 B1 | * | 5/2001 | Ference et al. ............. 257/777 |
| 6,271,598 B1 | | 8/2001 | Vindasius et al. |
| 6,291,267 B1 | * | 9/2001 | Dore et al. ................. 438/108 |
| 6,292,368 B1 | * | 9/2001 | Pradel ........................ 361/719 |
| 6,294,406 B1 | * | 9/2001 | Bertin et al. ............... 438/109 |
| 6,365,963 B1 | * | 4/2002 | Shimada ..................... 257/686 |
| 6,369,448 B1 | * | 4/2002 | McCormick ................ 257/777 |
| 6,489,669 B2 | * | 12/2002 | Shimada et al. ............ 257/686 |
| 6,489,686 B2 | * | 12/2002 | Farooq et al. .............. 257/777 |
| 6,492,726 B1 | * | 12/2002 | Queck et al. ............... 257/723 |
| 6,521,984 B2 | * | 2/2003 | Matsuura .................... 257/687 |

* cited by examiner

Primary Examiner—Jasmine Clark

(57) ABSTRACT

An integrated circuit package includes a package substrate having a first surface including a first array of interconnection sites and a second array of interconnection sites. A first integrated circuit die has a first surface including an array of interconnection sites. A second integrated circuit die has a first surface including an array of interconnection sites. The first array of interconnection sites is electrically connected to the array of interconnection sites of the second integrated circuit die. The second array of interconnection sites is electrically connected to the array of interconnection sites of the first integrated circuit die. The first integrated circuit die is positioned amid the package substrate and the second integrated circuit die.

11 Claims, 25 Drawing Sheets

ID

INTEGRATED CIRCUIT PACKAGE EMPLOYING FLIP-CHIP TECHNOLOGY AND METHOD OF ASSEMBLY

CROSS REFERENCE TO RELATED APPLICATION

This patent application is related to U.S. patent application Ser. No. 10/199,438, entitled "Flip-Chip Integrated Circuit Package And Method Of Assembly", filed on even date herewith, assigned to the same assignee, and incorporated herein by reference thereto.

TECHNICAL FIELD

This invention relates to a flip-chip integrated circuit assembly, and processes for assembling the integrated circuit assembly using flip-chip techniques.

BACKGROUND OF THE INVENTION

In recent years, technologies have emerged which can provide high density electrical interconnections between an integrated circuit (IC) chip and a substrate to form IC assemblies, otherwise known as IC packages. These technologies for forming electrical connections between an IC chip and a substrate are commonly known as wire bonding, tape-automatic bonding (TAB) and solder flip-chip bonding. Although, all these bonding techniques can be used to form high density electrical interconnections, the use of one particular technique over another is typically dictated by the desired number and spacing of the electrical connections on the IC chip and the substrate, as well as the permissible cost for assembling the IC package.

In a comparison of these three techniques, wire bonding is the most common technique for electrically connecting an IC chip to a substrate. This is due to that fact that this technique provides the maximum number of chip connections with the lowest cost per connection. A disadvantage of wire bonding is that inductance present in the wires used in connecting the IC chip to the substrate degrades the electrical performance of the assembled IC package. Moreover, since the wires connect perimeter connections of the IC chip to contacts on the substrate in areas not occupied by the IC chip, wire bonding electrical interconnects require a relatively large surface area of the substrate. Lastly, since wire bonding requires each connection between the IC chip and the substrate to be made one at a time, the process of electrically interconnecting an IC chip to a substrate using the wire bonding technique is somewhat time consuming.

TAB bonding permits a higher density of electrical interconnects when compared to wire bonding. However, TAB bonding is more expensive than wire bonding because TAB bonding requires special tooling for each different IC chip design. Also, like wire bonding, TAB bonding requires perimeter connections and therefore a relatively large surface area of the substrate to accomplish the IC chip and substrate electrical interconnect. Moreover, like wire bonding, undesirable inductance as a result of TAB bonding degrades the electrical performance of the IC chip circuitry.

Flip-chip bonding is achieved by providing an IC chip with an area array of solder wettable contact pads which comprise the signal terminals on the chip. A matching footprint of solder wettable contact pads are provided on the substrate. Before assembly onto the substrate, solder bumps are deposited on the metal pads of the chip and/or the substrate. The chip is then placed upside down on the upper surface of the substrate such that the metal pads (solder bumps) of the chip are in alignment with the metal pads (solder bumps) of the substrate. All connections between the chip and the substrate are then made simultaneously by heating the solder bumps to a reflow temperature at which the solder flows and an electrically conductive joint is formed between the contact pads of the IC chip and the substrate.

When compared to wire bonding and TAB bonding, flip-chip bonding of an IC chip to a substrate provides the advantage of requiring less surface area on the substrate, and thereby facilitates high-density interconnections commonly required in IC assemblies. Since the interconnections between the substrate and the IC chip in flip-chip bonding are short, well controlled electrical characteristics are provided, and undesirable inductance that can degrade the electrical performance of the IC chip circuitry is minimized. In other words, high speed signals are thus propagated in and through the packaged integrated circuits with minimum delay and distortion.

There is a need for improved integrated circuit assemblies. In particular there is a need for an improved integrated circuit assembly that can be assembled using flip-chip bonding techniques to achieve a packaged integrated circuit having low interconnect capacitance, thereby improving signal speed and eliminating some need for off chip driver cells. The improved integrated circuit assembly should provide these features while being amenable to high volume low defect manufacturing.

SUMMARY OF THE INVENTION

One embodiment of the present invention is an integrated circuit package that includes a package substrate having a first surface including a first array of interconnection sites and a second array of interconnection sites. A first integrated circuit die has a first surface including an array of interconnection sites electrically connected to the second array of interconnection sites of the package substrate. A second integrated circuit die has a first surface including an array of interconnection sites electrically connected to the first array of interconnection sites of the package substrate. The first integrated circuit die is positioned amid the package substrate and the second integrated circuit die.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention of the present invention will be readily appreciated as the same become better understood by reference to the following detailed description when considered in connection with the accompanying drawings, in which like reference numerals designate like parts throughout the figures thereof, and wherein.

DETAILED DESCRIPTION OF THE PREFERRED EMBODIMENTS

Figure 1:
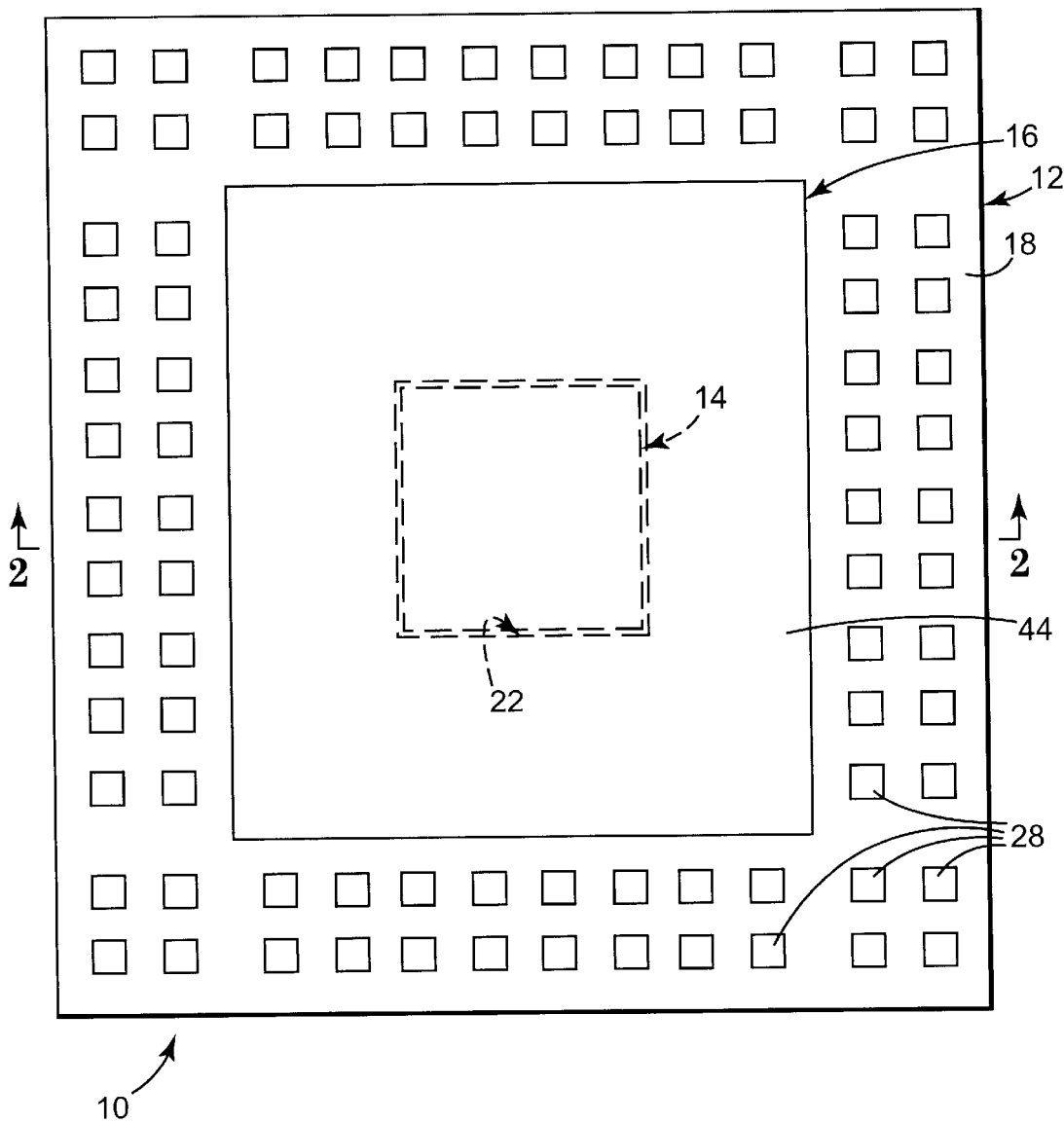
FIG. 1 is a top elevational view of an integrated circuit package in accordance with one embodiment of the present invention.
Figure 2:
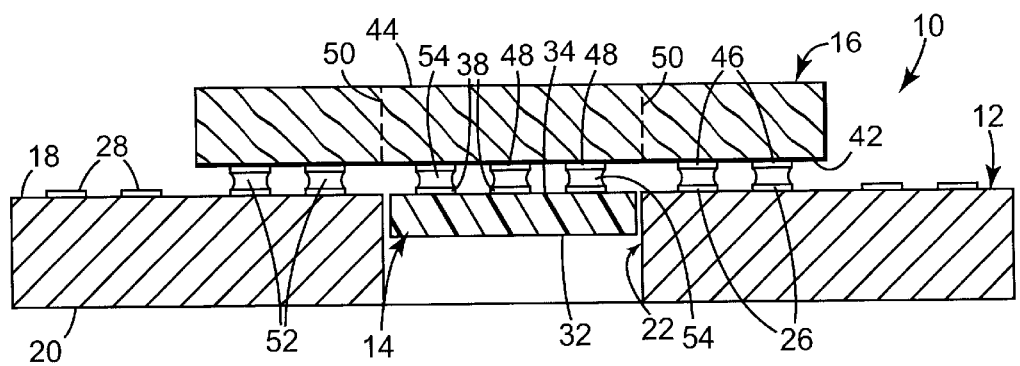
FIG. 2 is a sectional view taken along line 2—2 in FIG. 1.
Figure 4:
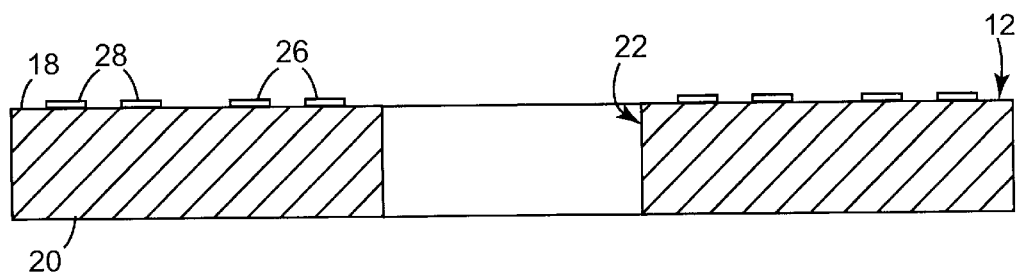
FIG. 4 is a sectional view taken along line 4—4 in FIG. 3.

FIGS. 1 and 2 depict an integrated circuit package 10 in accordance with one preferred embodiment of the present invention. The integrated circuit package 10 includes a package substrate 12, a first integrated circuit (IC) die 14, such as an IC memory die, and a second IC die 16, such as a processor die. As seen best in FIGS. 2–4, the package substrate 12 includes an upper or first surface 18 and an opposite lower or second surface 20. The first surface 18 of the package substrate 12 defines a through opening 22 of the package substrate 12. As seen in FIG. 2, the through opening 22 of the package substrate 12 is sized to accommodate the first IC die 14. In particular, the length, width and depth dimensions of the recessed area 22 are sized to fully accommodate the length, width and height dimensions of the first IC die 14.

Figure 3:
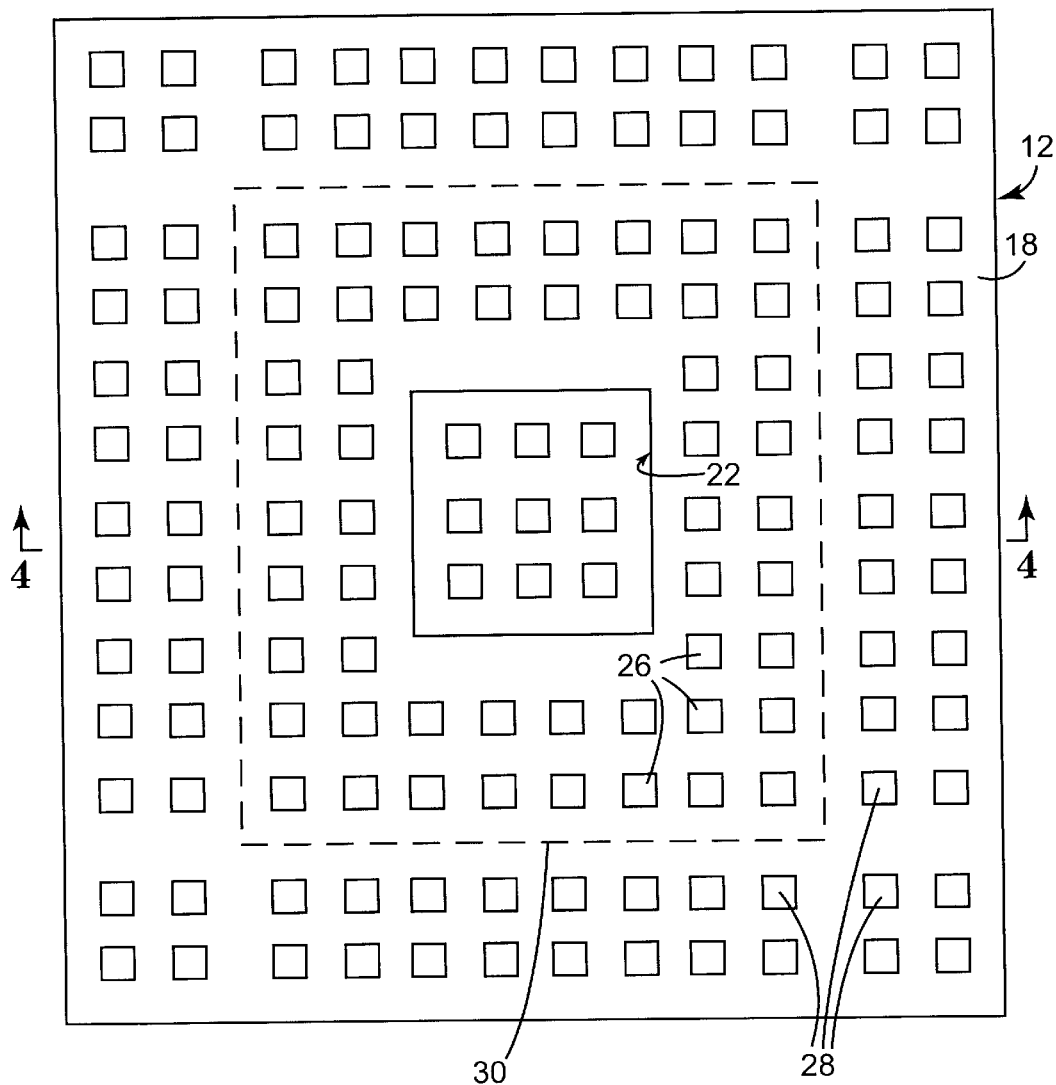
FIG. 3 is a top elevational view of a package substrate of the integrated circuit package shown in FIGS. 1 and 2.

The first surface 18 of the package substrate surrounding the through opening 22 of the package substrate 12 includes a first land grid array of interconnection sites or first contact pads 26. The first surface 18 of the package substrate 12 also includes a second land grid array of interconnection sites or second contact pads 28 concentrically surrounding the first contact pads 26. The dashed line 30 in FIG. 3 depicts the dividing line between the first and second contacts pads 26, 28 on the first surface 18 of the package substrate 12.

As seen best in FIG. 2, the first IC die 14 includes a first surface 32 and an opposite second surface 34. The second surface 34 of the first IC die 14 includes a land grid array of interconnection sites or contact pads 38.

The second IC die 16 includes a lower or first surface 42 and an opposite upper or second surface 44. The first surface 42 of the second IC die 16 includes a first land grid array of interconnection sites or first contact pads 46. The first surface 42 of the second IC die 16 further includes a second land grid array of interconnection sites or second contact pads 48 concentrically surrounded by the first contact pads 46. Dashed lines 50 in FIG. 2 depict the dividing line between the first and second contacts pads 46, 48 on the first surface 42 of the second IC die 16. The first contact pads 46 of the second IC die 16 are electrically connected to the first contact pads 26 of the package substrate 12 by way of reflowed solder joints 52. The second contact pads 48 of the second IC die 16 are electrically connected to the contact pads 38 on the second surface 34 of the first IC die 14 by way of reflowed solder joints 54. As seen in FIGS. 1 and 2, in the assembled IC package 10, the first IC die 14 is positioned amid (i.e., between) the package substrate 12 and the second IC die 16. In particular, the first IC die 14 is positioned within the through opening 22 of the package substrate 12. The second contact pads 28 of the package substrate 12 are provided for the electrical connection of further components (not shown). Alternatively, the second contact pads 28 can take the form of traces that are connectable to other electronic components. In this alternative version, the IC package 10 could be in essence the main printed circuit board of an electronic component. In addition, although the contact pads 26, 28, 38, 46, 48 have been described as land grid arrays, the contact pads can take other forms, such as ball grid arrays.

Figure 5A:
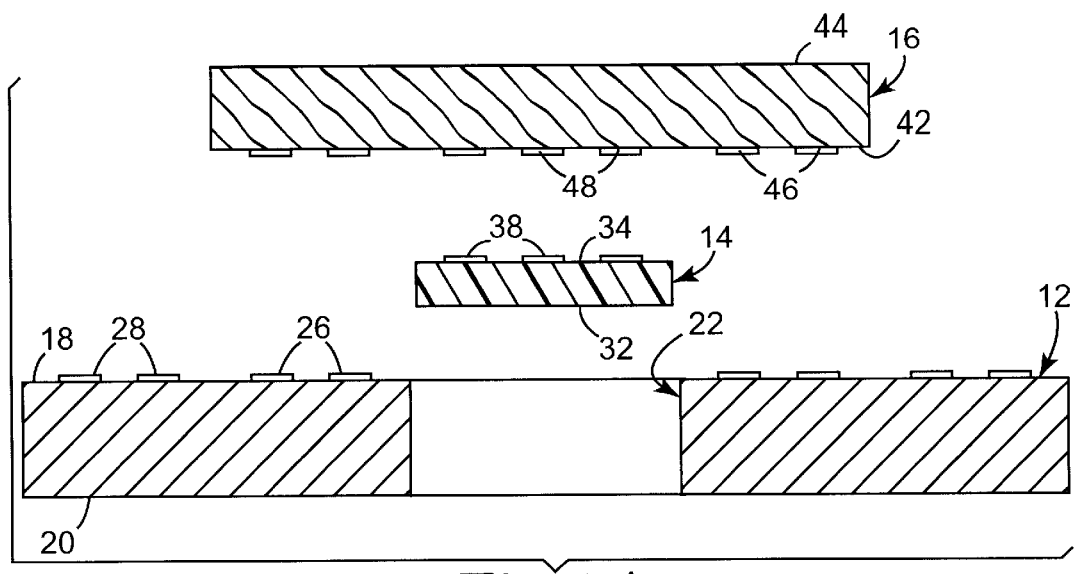
FIGS. 5A–5E illustrate a method of assembling the integrated circuit package of FIGS. 1 and 2 in accordance with one embodiment of the present invention.
Figure 5B:
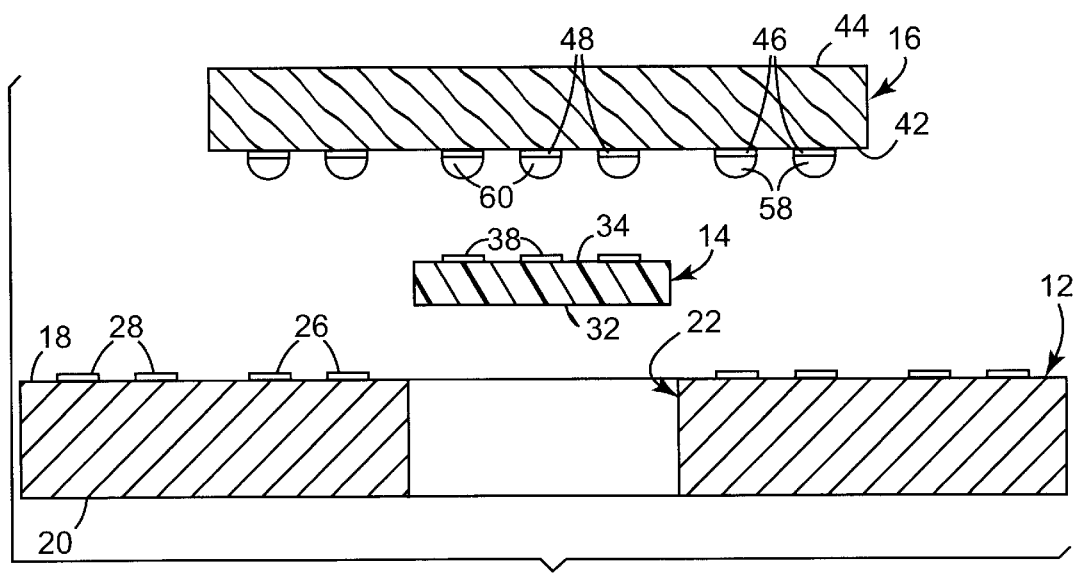
Figure 5C:
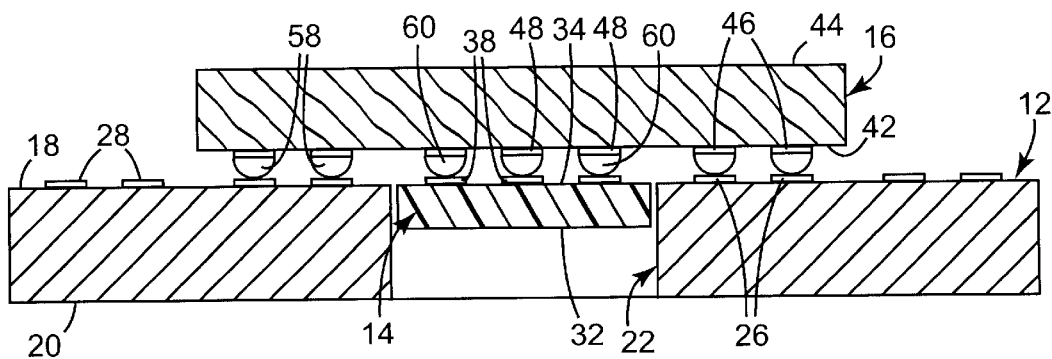
Figure 5D:
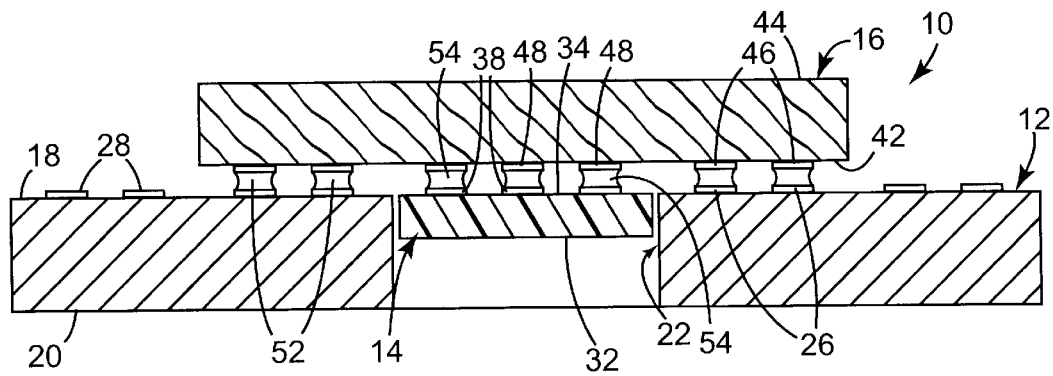

Assembly of the integrated circuit package 10 (shown in FIGS. 1 and 2) in accordance with one preferred embodiment of the present invention is illustrated in FIGS. 5A–5E. FIG. 5A illustrates the package substrate 12, the first IC die 14 and the second IC die 16 of the integrated circuit package 10 at the start of the assembly process. In FIG. 5B solder bumps 58 and 60 have been deposited in a known manner on the first and second contact pads 46, 48, respectively, on the first surface 42 of the second IC die 16. In FIG. 5C, the first IC die 14 has been positioned (i.e., engaged) with the second IC die 16 such that the contact pads 38 of the first IC die 14 are substantially aligned with the second contact pads 48 (i.e., solder bumps 60) of the second IC die 16. The inherent tackiness of flux associated with the solder bumps 60 tends to hold the first IC die 14 on the second IC die 16. In addition, in FIG. 5C, the second IC die 16 is positioned (i.e., engaged) atop the package substrate 12 with the first IC die 14 positioned amid the package substrate 12 and the second IC die 16. In particular, the first IC die 14 is positioned within the through opening 22 of the package substrate 12. In this position, the first contact pads 46 (i.e., solder bumps 58) of the second IC die 16 are substantially aligned with the first contact pads 26 of the package substrate 12. In FIG. 5D, sufficient heat is applied to the IC package 10 (in a known manner) to simultaneously reflow the solder bumps 58, 60 to simultaneously create the reflowed solder joints 52, 54 thereby simultaneously electrically connecting together the package substrate 12, the second IC die 16 and the first IC die 14 and completing assembly of the IC package 10. It bears noting that the surface tension of the molten solder (particularly at the interface of the contact pads 38 of the first IC die 14 and the second contact pads 48 of the second IC die 16) tends to help align the package substrate 12, the first IC die 14 and the second IC die 16 if they are slightly misaligned before the reflow process step.

If desired, physical integrity of the IC package 10 can be optimized by underfilling, in a known manner, one or all gaps in the IC package with a suitable epoxy. For example as shown in FIG. 5E, epoxy 62 may be used to just underfill gaps between the second IC die 16 and the package substrate 12 at the first contact pads 46 of the second IC die 16 and the first contact pads 26 of the package substrate 12; or epoxies 62 and 63 can be used to underfill gaps between the second IC die 16 and the package substrate 12 at the first contact pads 46 of the second IC die 16 and the first contact pads 26 of the package substrate 12; and gaps between the first IC die 14 and the second IC die 16 at the contact pads 38 of the first IC die 14 and the second contact pads 48 of the second IC die 16.

Figure 6:
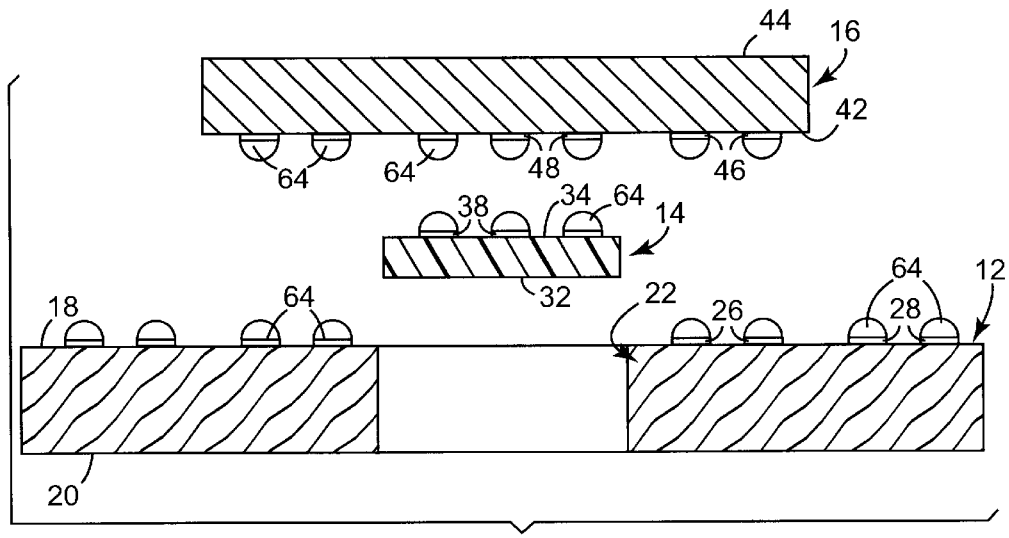
FIG. 6 is sectional view similar to FIG. 5B illustrating one embodiment of the present invention in which both contact pads to be connected have a solder bump.

Although, it has been described in connection with FIG. 5B, that the solder bumps 58, 60 are only deposited on the first and second contact pads 46, 48 of the second IC die 16, it is to be understood that alternatively the solder bumps could only be deposited on the first contact pads 26 of the package substrate 12, and on the contact pads 38 of the first IC die 14. As illustrated in FIG. 6, as a further alternative, solder bumps 64 can be applied to all of the contact pads 26, 28, 38, 46, 48. Moreover, as even a further alternative to solder bumps and flux, a solder paste can be employed.

Figure 7A:
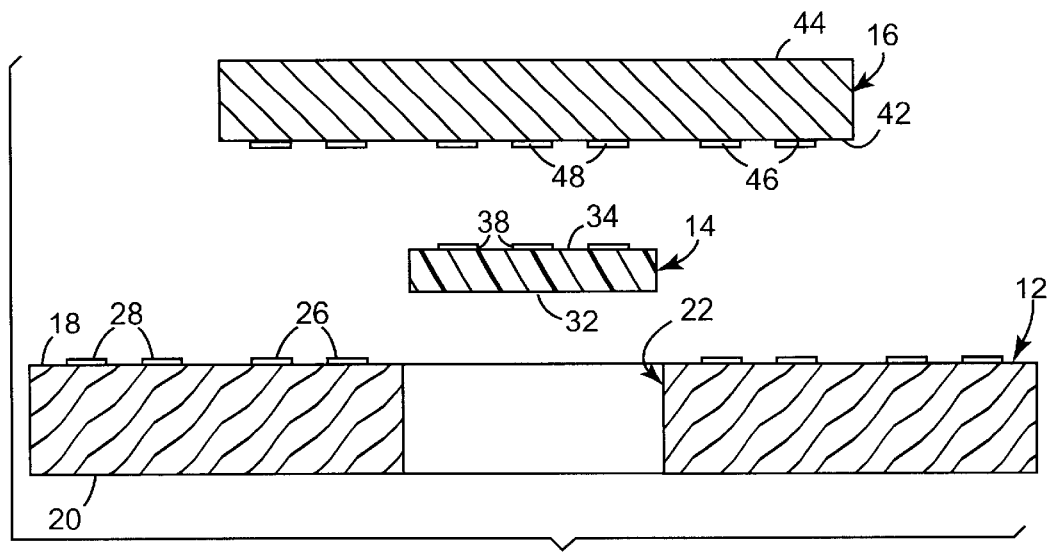
FIGS. 7A–7F illustrate an alternative method of assembling the integrated circuit package of FIGS. 1 and 2.
Figure 7B:
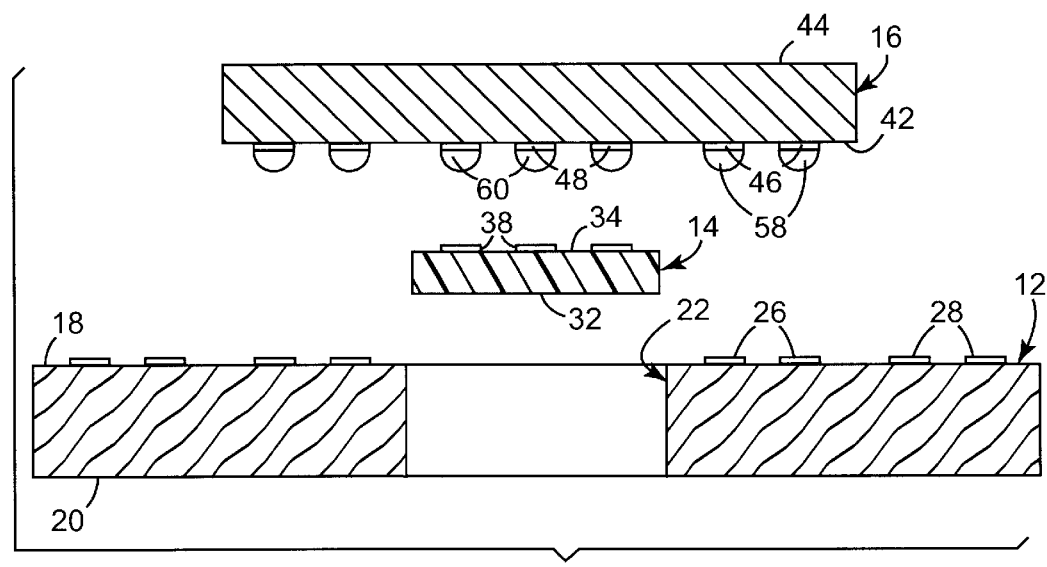
Figure 7C:
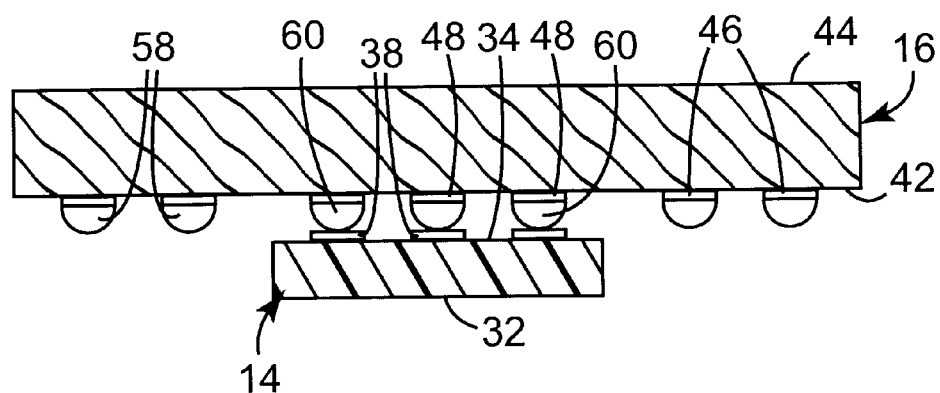
Figure 7D:
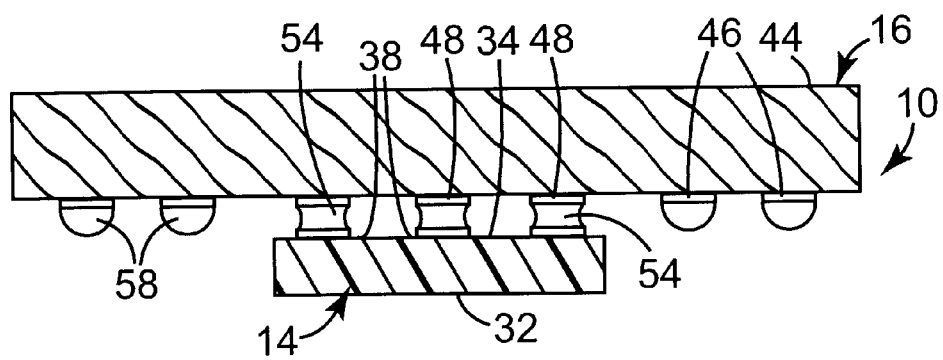
Figure 7E:
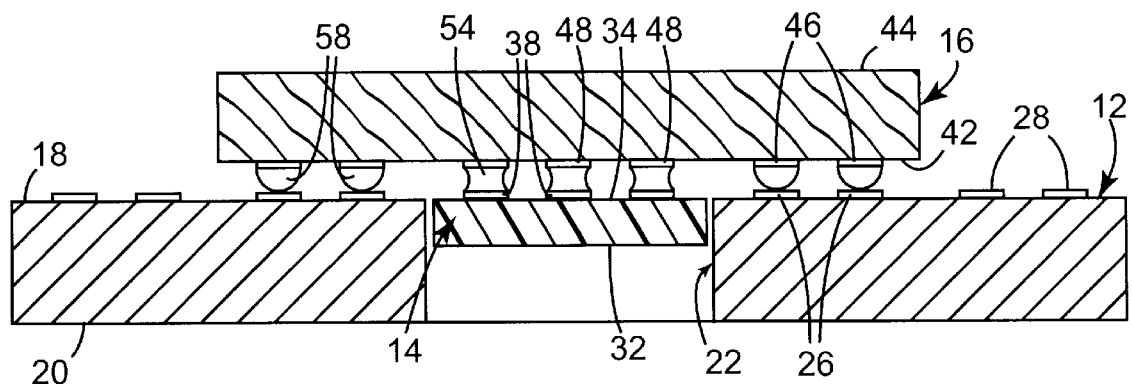
Figure 7F:
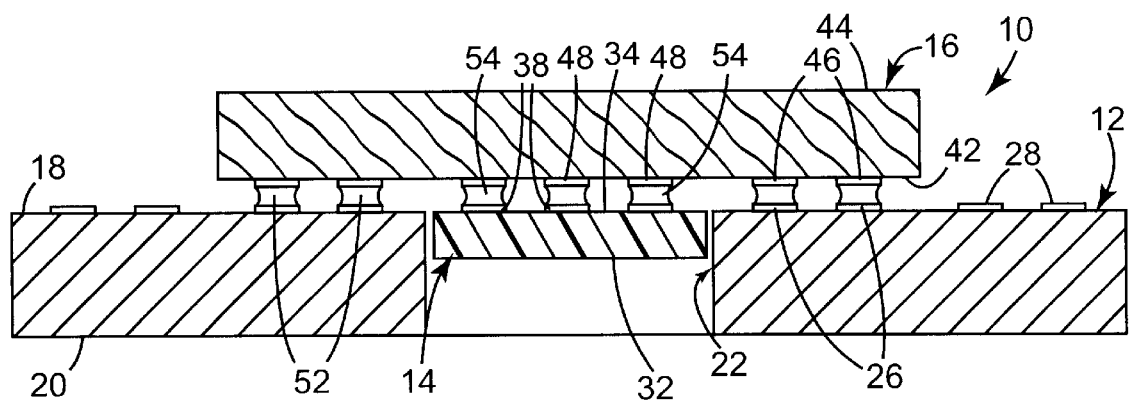

Assembly of the integrated circuit package 10 (shown in FIGS. 1 and 2) in accordance with one alternative embodiment of the present invention is illustrated in FIGS. 7A–7F. The steps depicted in FIGS. 7A and 7B are identical to the steps previously described in connection with FIGS. 5A and 5B. In FIG. 7C, the first IC die 14 has been positioned (i.e., engaged) with the second IC die 16 such that the contact pads 38 of the first IC die 14 are substantially aligned with the second contact pads 48 (i.e., solder bumps 60) of the second IC die 16. Once again, the inherent tackiness of flux on the solder bumps 60 holds the first IC die 14 to the second IC die 16. In FIG. 7D, sufficient heat is applied to the IC package 10 to reflow the solder bumps 60 to create the reflowed solder joints 54 thereby electrically connecting together the second IC die 16 and the first IC die 14. In FIG. 7E, the second IC die 16 (with the first IC die 14 attached thereto) is been positioned (i.e., engaged) atop the package substrate 12 with the first IC die 14 positioned amid (i.e., between) the package substrate 12 and the second IC die 16 in the through opening 22. In this position, the first contact pads 46 (i.e., solder bumps 58) of the second IC die 16 are substantially aligned with the first contact pads 26 of the package substrate 12. In FIG. 7F, sufficient heat is applied to the IC package 10 to reflow the solder bumps 58 to create the reflowed solder joints 52 thereby electrically connecting the package substrate 12 to the previously assemble first and second IC dies 14, 16, thereby completing assembly of the IC package 10.

Figure 5E:
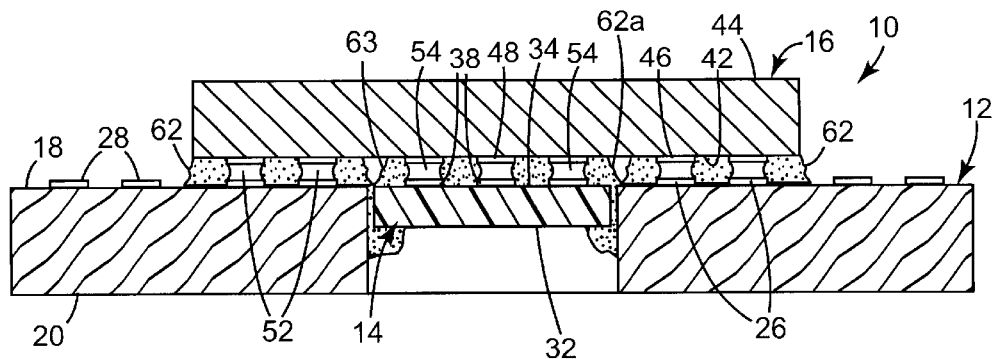

The physical integrity of the IC package 10 assembled with this alternative method can, if desired, be optimized by underfilling one or all gaps in the IC package with a suitable epoxy as previously discussed with regards to FIG. 5E. Likewise, the particular contact pads that have solder bumps deposited thereon can be varied as previously described above.

Figure 8:
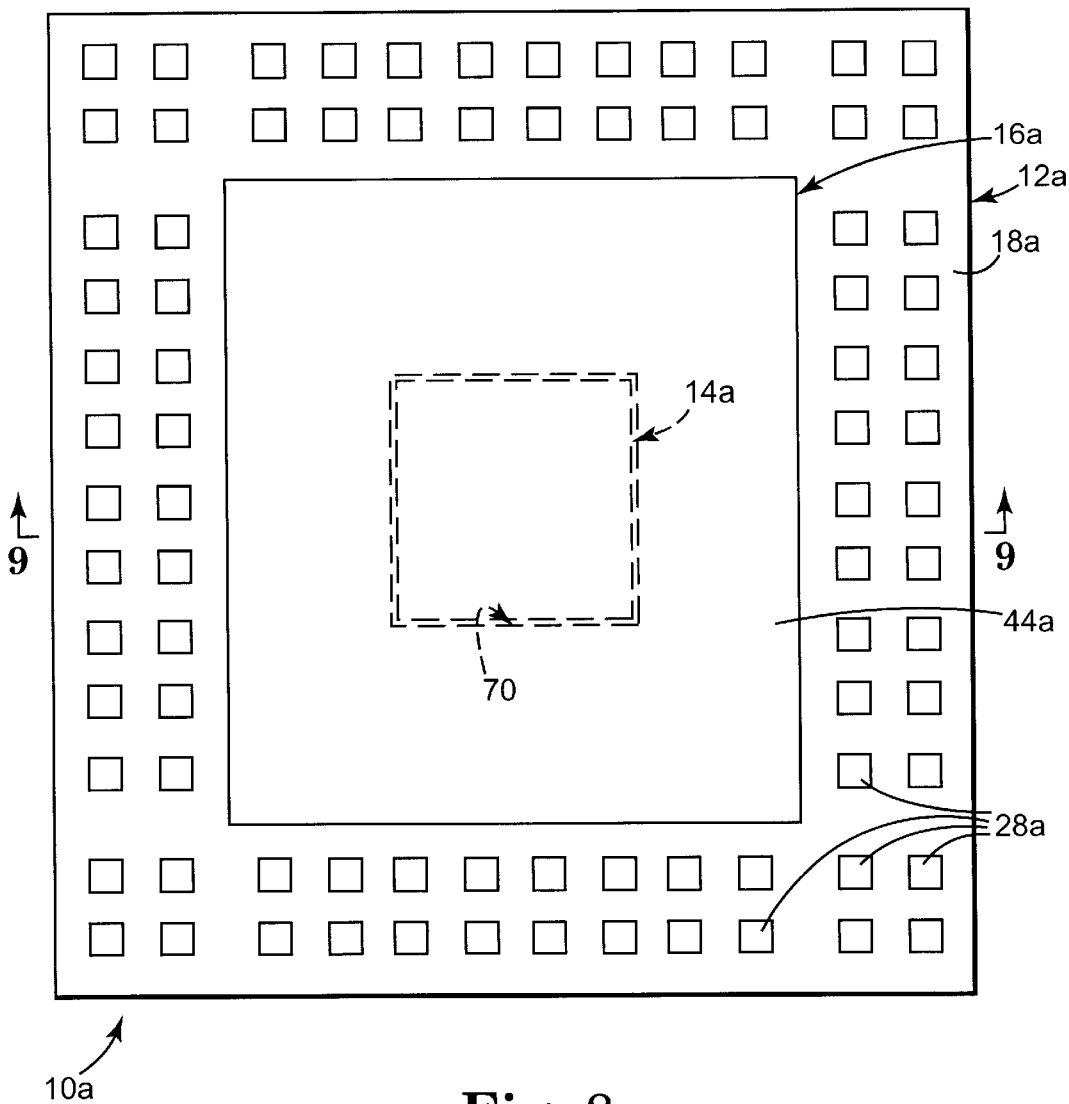
FIG. 8 is a top elevational view of an integrated circuit package in accordance with one alternative embodiment of the present invention.
Figure 9:
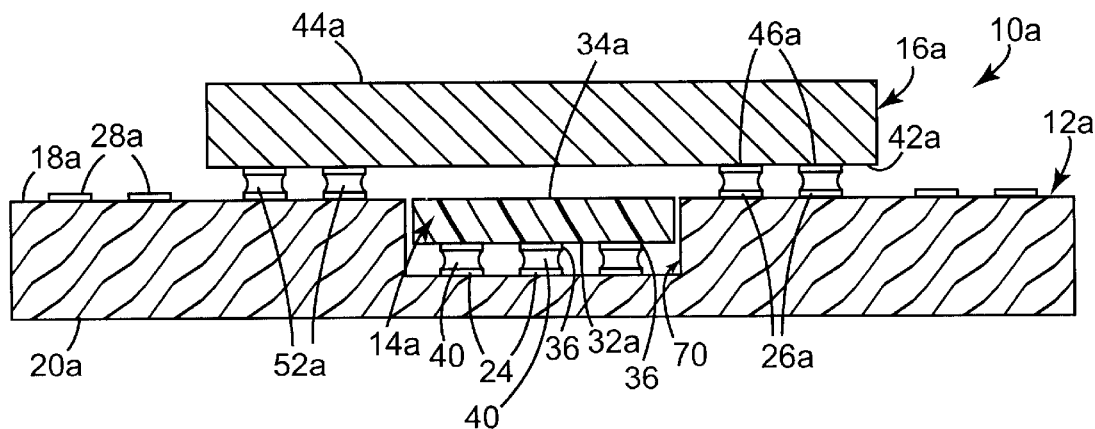
FIG. 9 is a sectional view taken along line 9—9 in FIG. 8.
Figure 11:
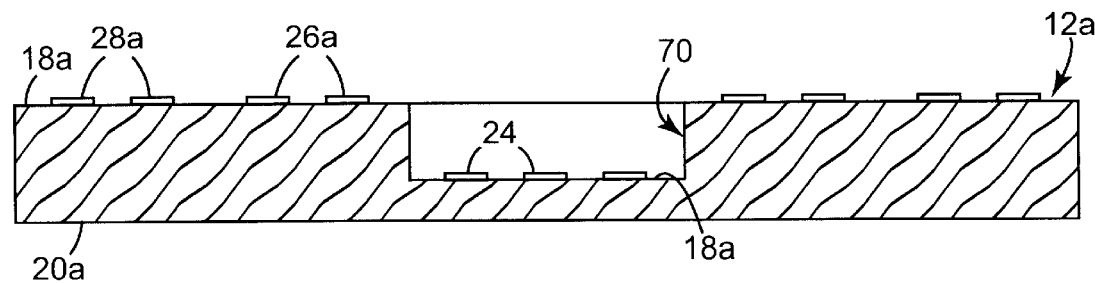
FIG. 11 is a sectional view taken along line 11—11 in FIG. 10.
Figure 10:
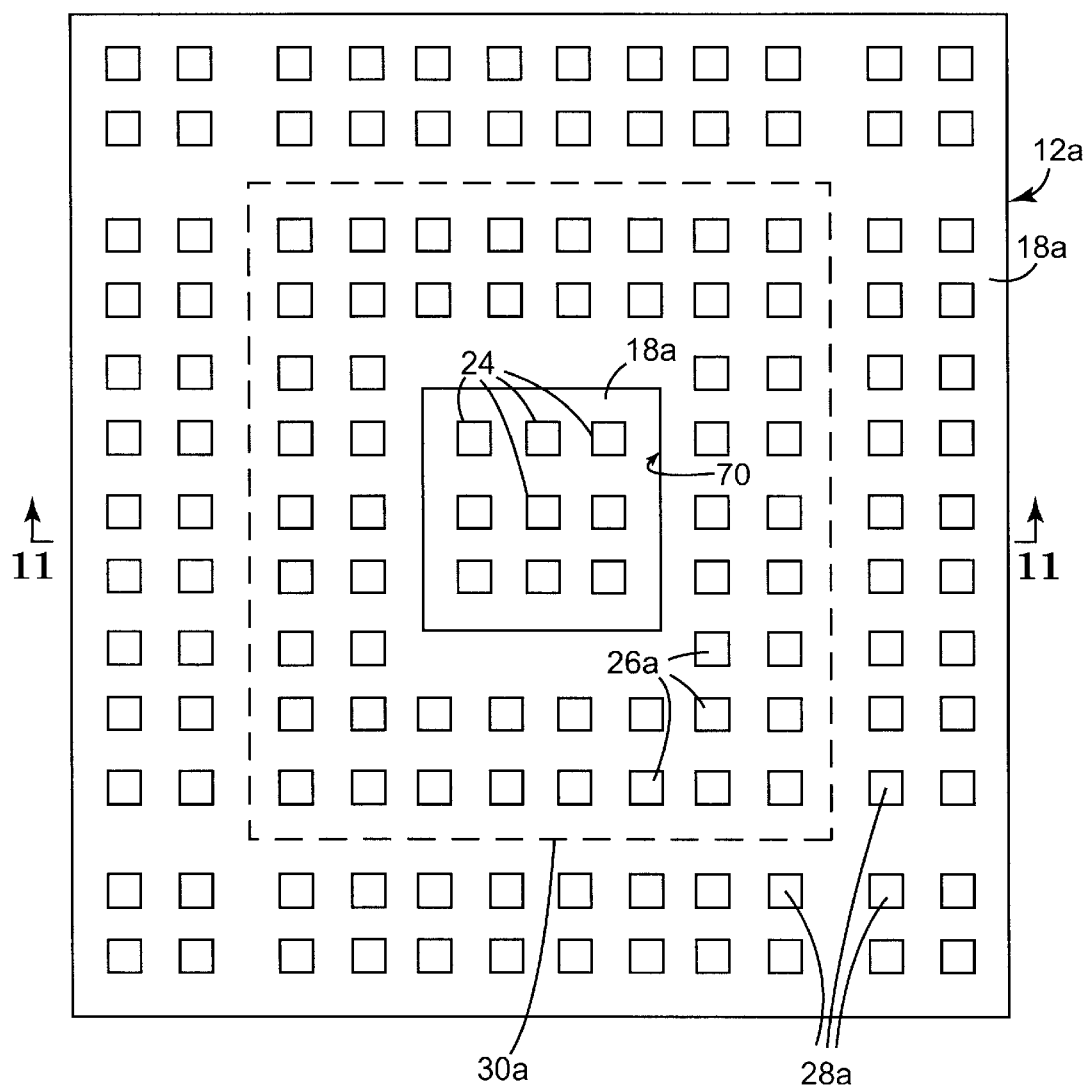
FIG. 10 is a top elevational view of a package substrate of the integrated circuit package shown in FIGS. 8 and 9.

FIGS. 8 and 9 depict one alternative integrated circuit package 10a. Parts in common with the preferred embodiment shown in FIGS. 1–7F are labeled with like numerals except for the inclusion of "a". The integrated circuit package 10a includes the package substrate 12a, the first integrated circuit (IC) die 14a, and the second IC die 16a. As seen best in FIGS. 9–11, the first surface 18a of the package substrate 12a defines a recessed area 70 (instead of the through opening 22). The recessed area 70 of the package substrate 12a is sized to accommodate: the first IC die 14a. In particular, the length, width and depth dimensions of the. recessed area 70 are sized to fully accommodate the length, width and height dimensions of the first IC die 14a. The first surface 18a in the recessed area 70 of the package substrate 12a includes a further land grid array of interconnection sites or further contact pads 24. The first contact pads 26a concentrically surround the recessed area 70 and the further contact pads 24 therein.

As seen best in FIG. 9, the first surface 32a includes a land grid array of interconnection sites or additional contact pads 36. The first IC die 14a is positioned within the recessed area 70 of the package substrate 12a, with the additional contact pads 36 of the first IC die 14a electrically connected to the further contact pads 24 of the package substrate 12a by way of reflowed solder joints 40. The reflowed solder joints 52a connect the first contact pads 26a of the package substrate 12a to the first contact pads 46a of the second IC die 16a. In this embodiment, the contact pads 38 and 48 and the reflowed solder joints 54 of the embodiment of FIGS. 1–7F have been eliminated and the first IC die 14a is electrically connected to the second IC die 16a through the package substrate 12a.

Figure 12A:
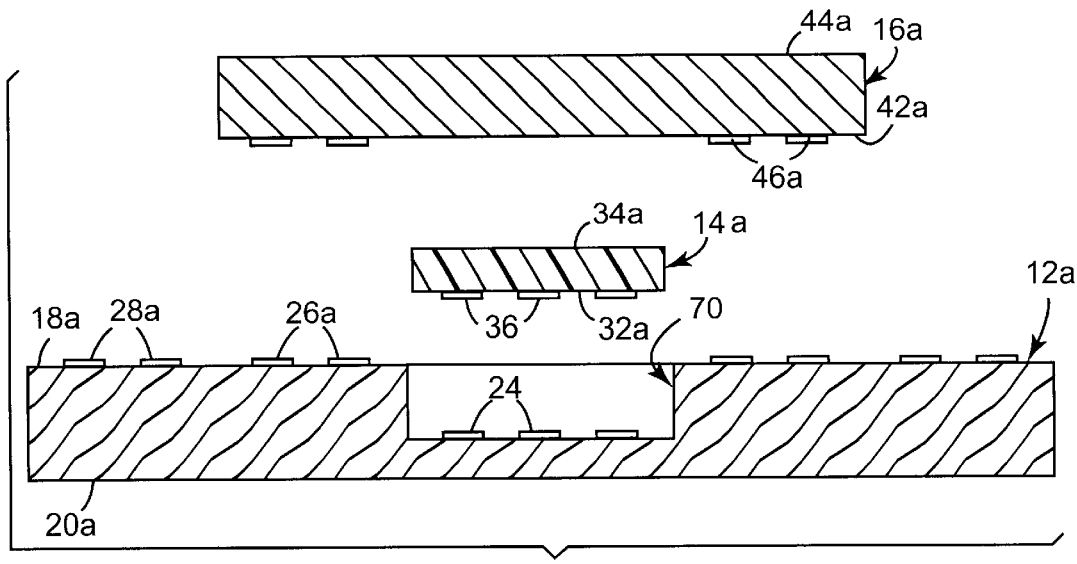
FIGS. 12A–12E illustrate a method of assembling the one alternative embodiment integrated circuit package of FIGS. 8 and 9.
Figure 12B:
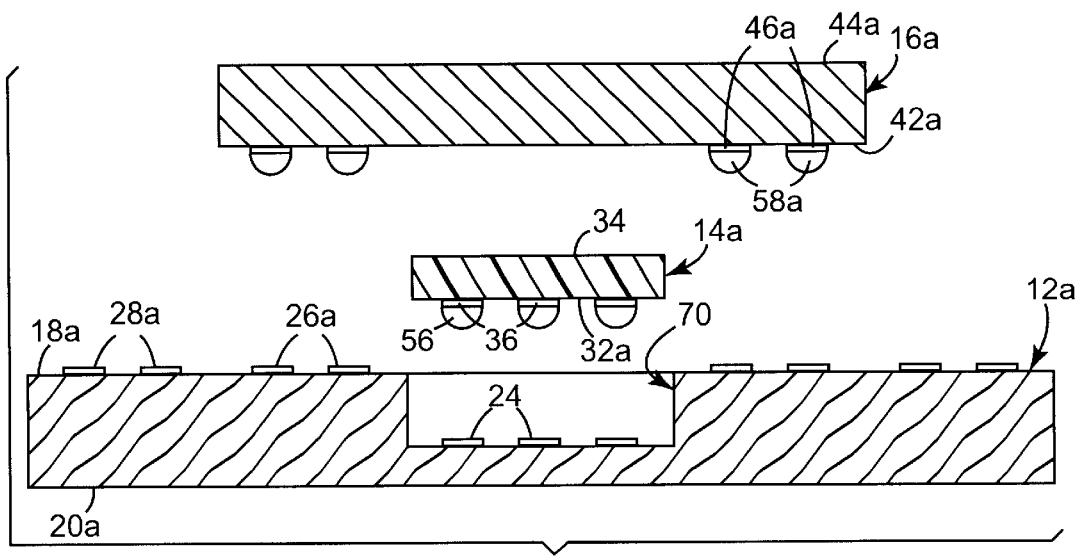
Figure 12C:
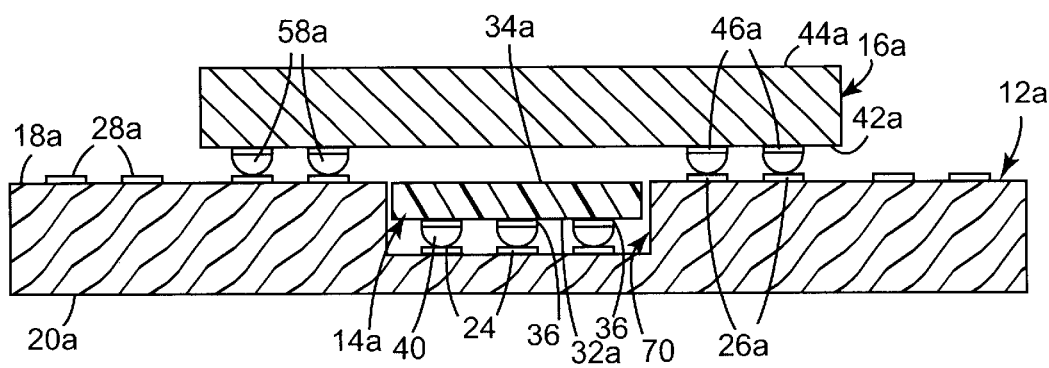
Figure 12D:
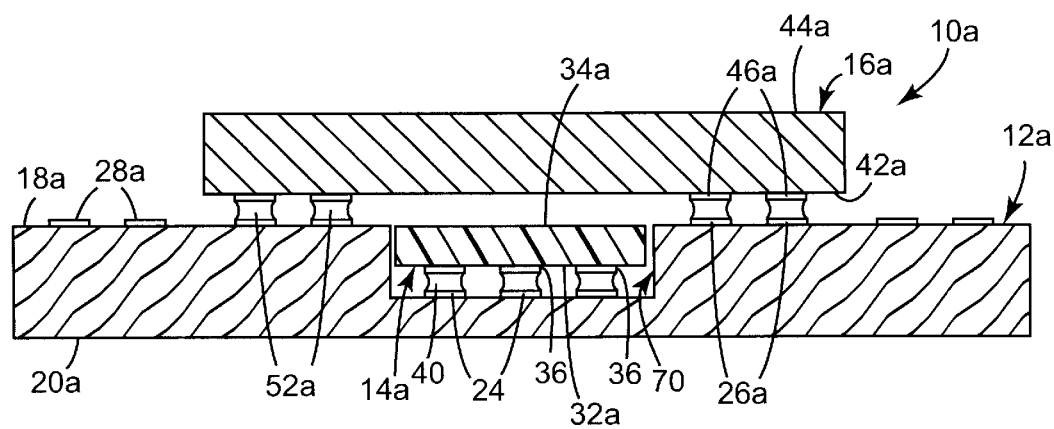

Assembly of the one alternative embodiment integrated circuit package 10a (shown in FIGS. 8 and 9) in accordance with one embodiment of the present invention is illustrated in FIGS. 12A–12E. FIG. 12A illustrates the package substrate 12a, the first IC die 14a and the second IC die 16a of the integrated circuit package 10a at the start of the assembly process. In FIG. 12B solder bumps 56 have been deposited on the additional contact pads 36 on the first surface 32a of the first IC die 14a, and the solder bumps 58a have been deposited on the contact pads 46a on the first surface 42a of the second IC die 16a. In FIG. 12C, the first IC die 14a has been positioned (i.e., engaged) in the recessed area 70 of the package substrate 12a such that the first contact pads 36 (i.e., solder bumps 56) of the first IC die 14 are substantially aligned with the first contact pads 24 of the package substrate 12a. Likewise the second IC die 16a has been positioned (i.e., engaged) atop the package substrate 12a with the first IC die 14a positioned between the package substrate 12a and the second IC die 16a and in the recessed area 70. In this position, the first contact pads 46a (i.e., solder bumps 58a) of the second IC die 16a are substantially aligned with the first contact pads 26a of the package substrate 12a. In FIG. 12D, sufficient heat is applied to the IC package 10 to simultaneously reflow the solder bumps 56, 58a to simultaneously create the reflowed solder joints 40, 52a thereby simultaneously electrically connecting together the package substrate 12a, the first IC die 14a and the second IC die 16a and completing assembly of the IC package 10.

Figure 12E:
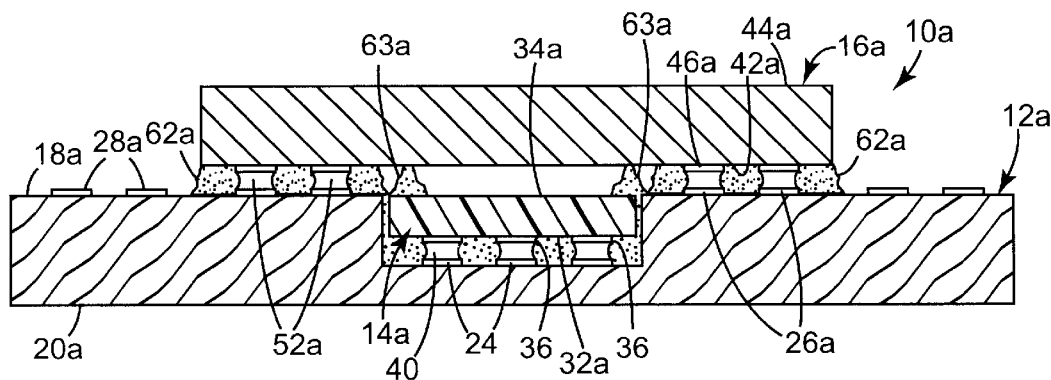
Figure 13:
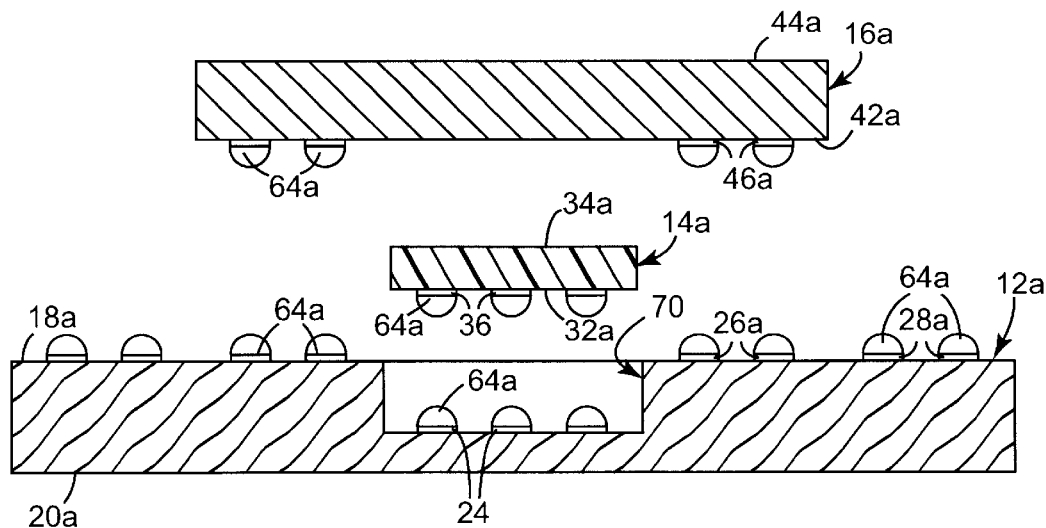
FIG. 13 is sectional view similar to FIG. 12B illustrating one embodiment of the one alternative embodiment of the integrated circuit package in which both contact pads to be connected have a solder bump.

If desired, physical integrity of the IC package 10a can be optimized by underfilling one or all gaps in the IC package with a suitable epoxy 62a, 63a (FIG. 12E). Moreover, the particular contact pads that include the solder bumps can be varied as previously described. For example, as illustrated in FIG. 13, as a further alternative, solder bumps 64a can be applied to all of the contact pads 24,26,28,36,46.

Figure 14A:
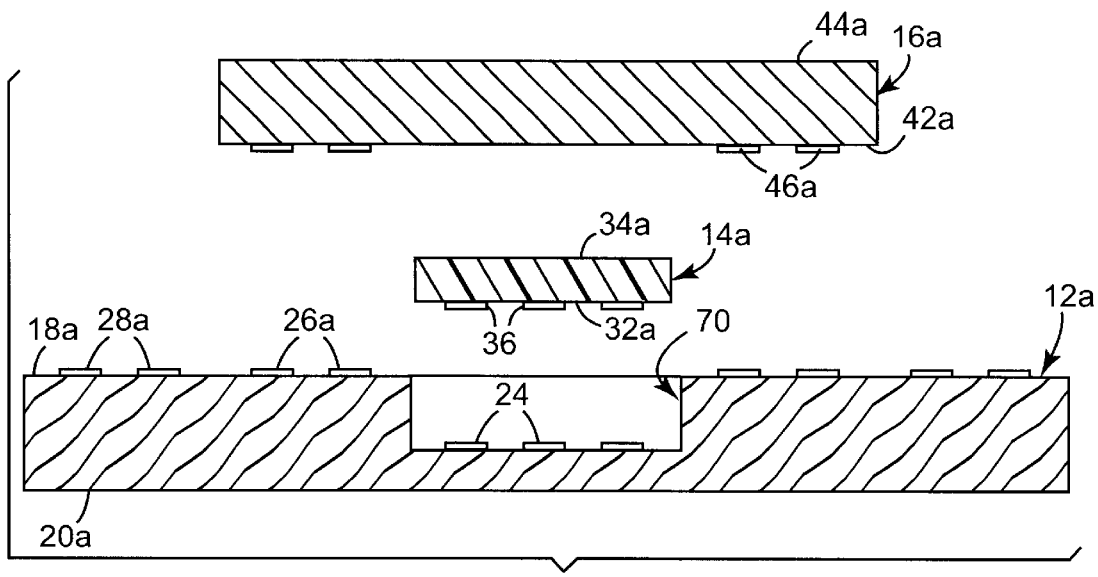
FIGS. 14A–14F illustrate an alternative method of assembling the integrated circuit package of FIGS. 8 and 9.
Figure 14B:
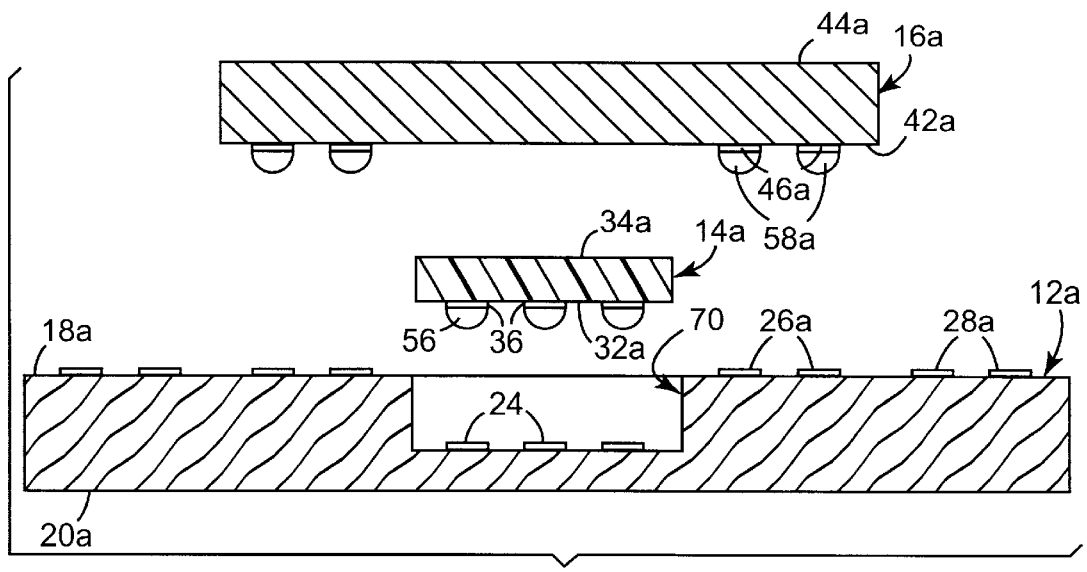
Figure 14C:
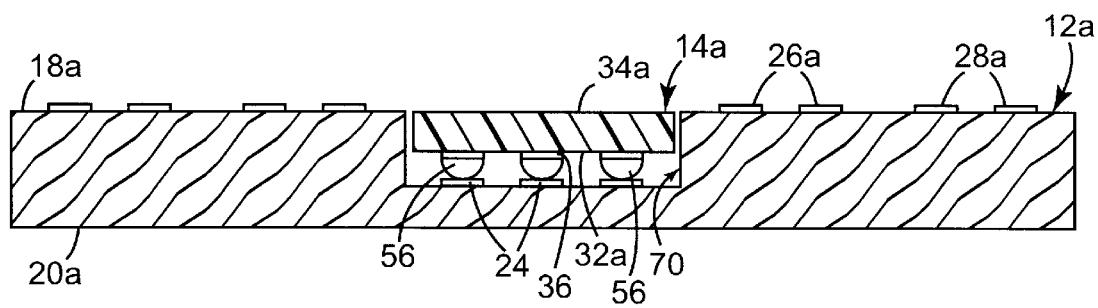
Figure 14D:
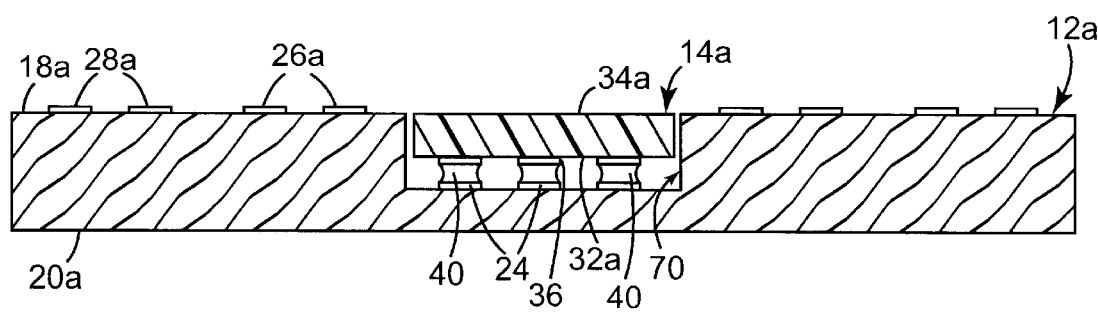
Figure 14E:
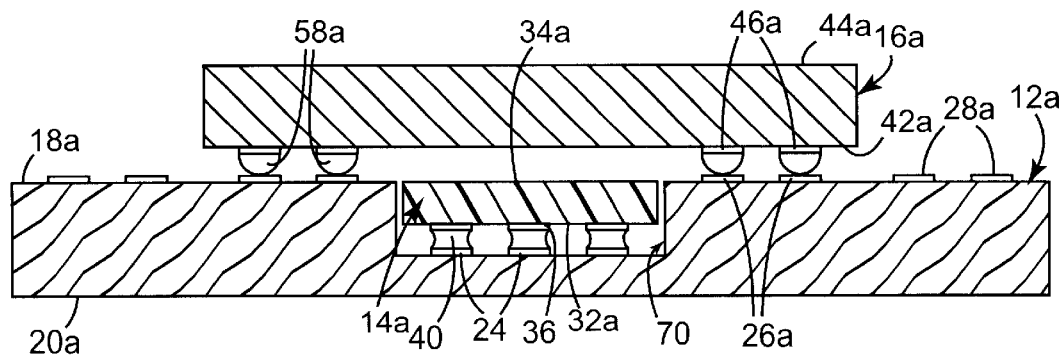
Figure 14F:
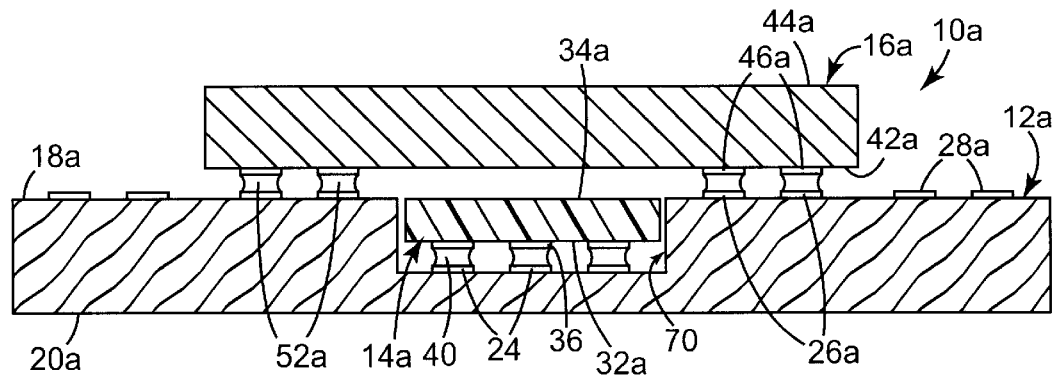

Assembly of the one alternative integrated circuit package 10a (shown in FIGS. 8 and 9) in accordance with one alternative embodiment of the present invention is illustrated in FIGS. 14A–14F. The steps depicted in FIGS. 14A and 14B are identical to the steps previously described in connection with FIGS. 12A and 12B. In FIG. 14C, the first IC die 14a has been positioned (i.e., engaged) in the recessed area 70 of the package substrate 12a such that the additional contact pads 36 (i.e., solder bumps 56) of the first IC die 14a are substantially aligned with the further contact pads 24 of the package substrate 12a. In FIG. 14D, sufficient heat is applied to the IC package 10a to reflow the solder bumps 56 to create the reflowed solder joints 40 thereby electrically connecting together the package substrate 12a and the first IC die 14a. In FIG. 14E, the second IC die 16a has been positioned (i.e., engaged) atop the package substrate 12a with the first IC die 14a positioned between the package substrate 12a and the second IC die 16a and in the recessed area 70. In this position, the first contact pads 46a (i.e., solder bumps 58a) of the second IC die 16a are substantially aligned with the second contact pads 26a of the package substrate 12a. In FIG. 14F, sufficient heat is applied to the IC package 10a to reflow the solder bumps 58a to create the reflowed solder joints 52a thereby electrically connecting the package substrate 12a to the previously assembled first and second IC dies 14a, 16a, thereby completing assembly of the IC package 10.

Figure 15:
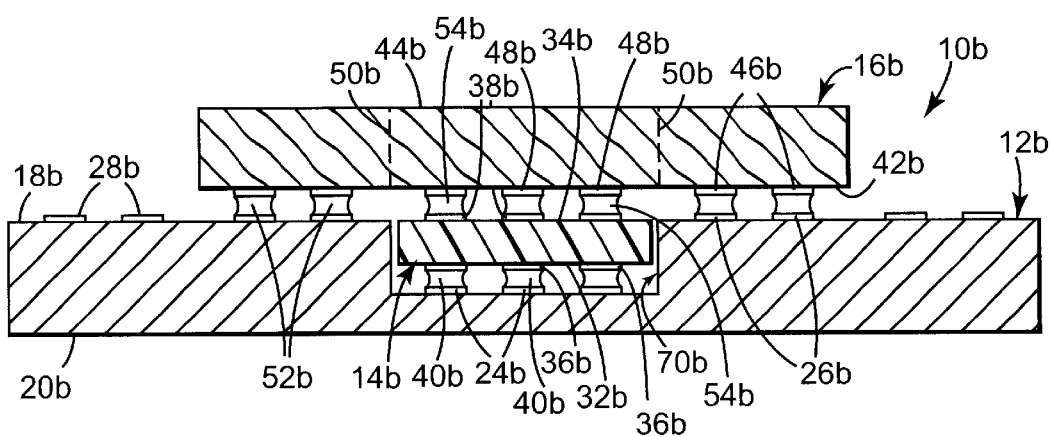
FIG. 15 is a sectional view of an integrated circuit package in accordance with one further embodiment of the present invention.

FIG. 15 depicts one further embodiment integrated circuit package 10b. The integrated circuit package 10b is a combination of integrated circuit package 10 (FIGS. 1–7F) and integrated circuit package 10a (FIGS. 8–14F). As such like parts are labeled with like numerals except for the inclusion of "b". The integrated circuit package 10b includes the package substrate 12b, the first integrated circuit (IC) die 14b, and the second IC die 16b. The first surface 18b of the package substrate 12b includes the recessed area 70b sized to accommodate the first IC die 14b.

The first surface 18b in the recessed area 70b includes the further contact pads 24b. The first surface 18b of the package substrate 12b also includes the first contact pads 26b and the second contact pads 28b. The first surface 32b of the first IC die 14b includes the additional contact pads 36b, while the second surface 34b of the first IC die 14b includes the contact pads 38b. The first surface 42b of the second IC die 16b includes the first and second contact pads 46b, 48b. The first IC die 14b is positioned within the recessed area 70b of the package substrate 12b, with the additional contact pads 36b of the first IC die 14b electrically connected to the further contact pads 24b of the package substrate 12b by way of the reflowed solder joints 40b. The first contact pads 46b are electrically connected to the first contact pads 26b of the package substrate 12b by way of the reflowed solder joints 52b. The second contact pads 48b are electrically connected to the contact pads 38b of the first IC die 14b by way of reflowed solder joints 54b.

Figure 16A:
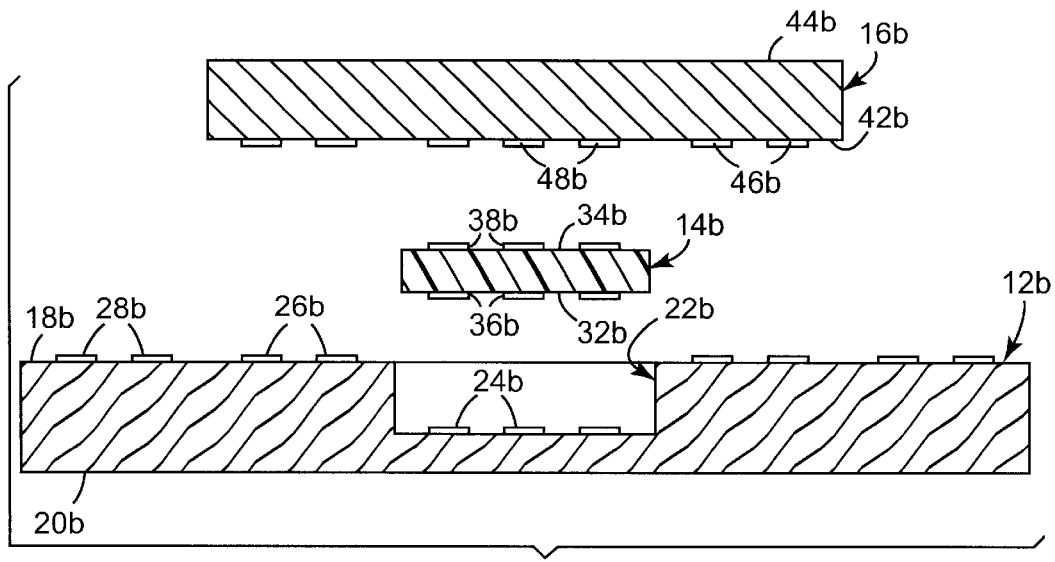
FIGS. 16A–16E illustrate a method of assembling the one further embodiment of the integrated circuit package of FIG. 15.
Figure 16B:
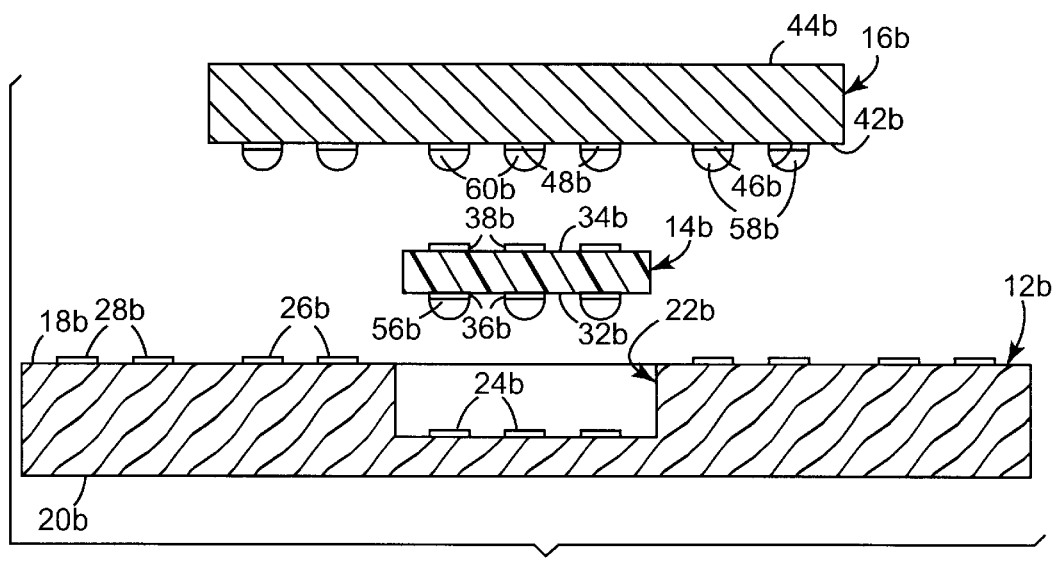
Figure 16C:
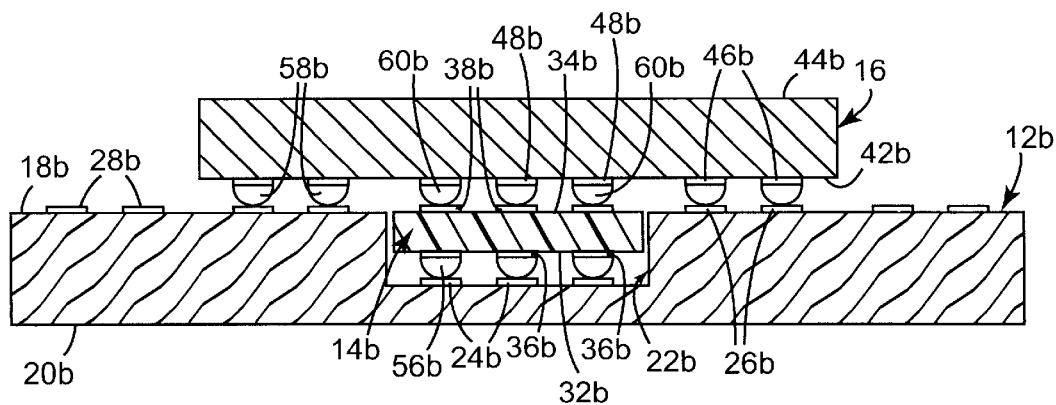
Figure 16D:
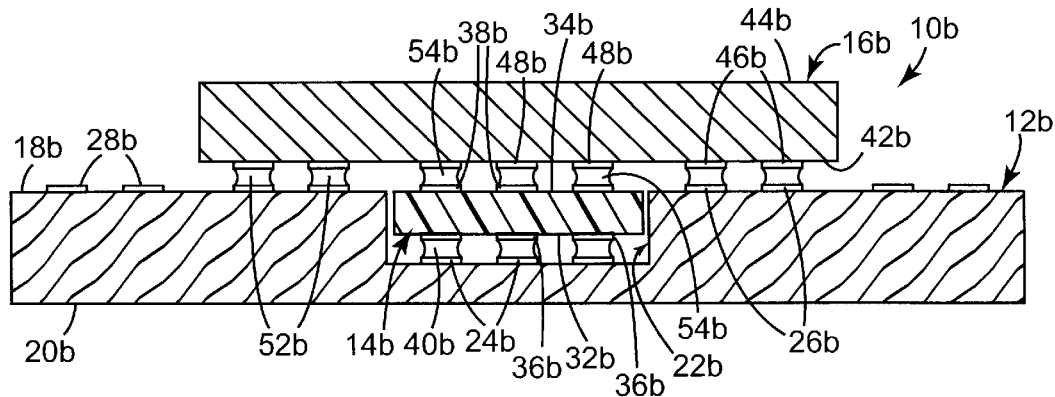

Assembly of the integrated circuit package 10b (shown in FIG. 15) in accordance with one embodiment is illustrated in FIGS. 16A–16E. FIG. 16A illustrates the package substrate 12b, the first IC die 14b and the second IC die 16b of the integrated circuit package 10b at the start of the assembly process. In FIG. 16B solder bumps 56b have been deposited on the additional contact pads 36b on the first surface 32b of the first IC die 14b, and solder bumps 58b and 60b have been deposited on the first and second contact pads 46b, 48b, respectively, on the first surface 42b of the second IC die 16b. In FIG. 16C, the first IC die 14b has been positioned (i.e., engaged) in the recessed area 70b of the package substrate 12b such that the additional contact pads 36b (i.e., solder bumps 56b) of the first IC die 14b are substantially aligned with the further contact pads 24b of the package substrate 12b. Likewise the second IC die 16b is positioned (i.e., engaged) atop the package substrate 12b with the first IC die 14b positioned between the package substrate 12b and the second IC die 16b and in the recessed area 70b. In this position, the first contact pads 46b (i.e., solder bumps 58b) of the second IC die 16b are substantially aligned with the first contact pads 26b of the package substrate 12b, and the second contact pads 48b (i.e., solder bumps 60b) of the second IC die 16b are substantially aligned with the contact pads 38b on the second surface 34b of the first IC die 14b. In FIG. 16D, sufficient heat is applied to the IC package 10b to simultaneously reflow the solder bumps 56b, 58b, 60b to simultaneously create the reflowed solder joints 40b, 52b, 54b thereby simultaneously electrically connecting together the package substrate 12b, the first IC die 14b and the second IC die 16b and completing assembly of the IC package 10b.

Figure 16E:
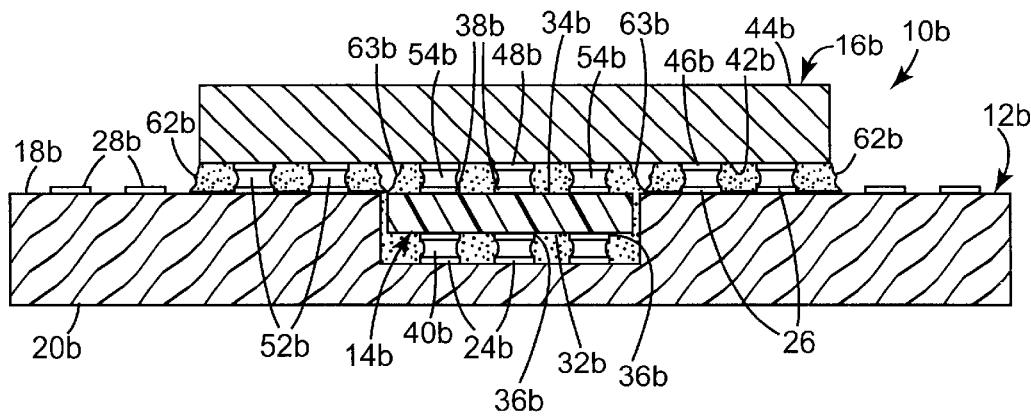
Figure 17:
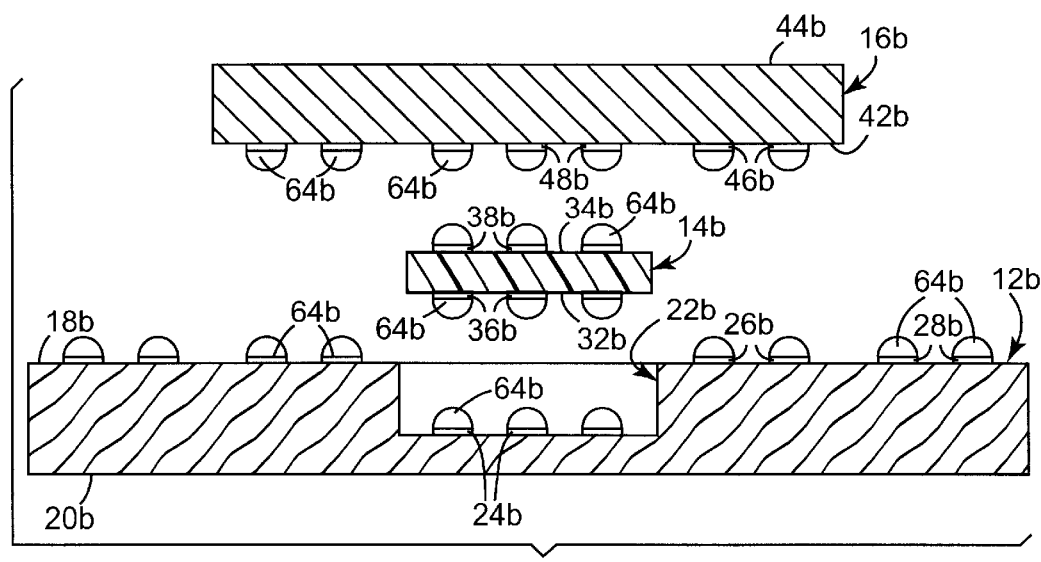
FIG. 17 is sectional view similar to FIG. 16B illustrating one further embodiment of the integrated circuit package in which both contact pads to be connected have a solder bump.

If desired, physical integrity of the IC package 10b can be optimized by underfilling one or all gaps in the IC package with a suitable epoxy 62, 63b (FIG. 16E). Moreover, the particular contact pads having the solder bumps can be varied as previously described. For example, as illustrated in FIG. 17, as a further alternative, solder bumps 64b can be applied to all of the contact pads 24b, 26b, 28b, 36b, 38b, 46b, 48b.

Figure 18A:
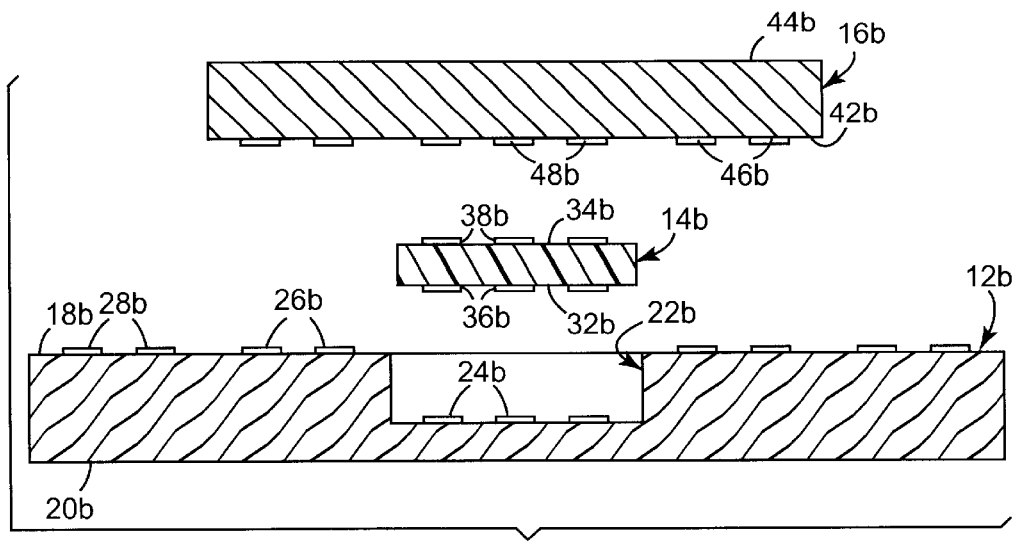
FIGS. 18A–18F illustrate an alternative method of assembling the integrated circuit package of FIG. 15.
Figure 18B:
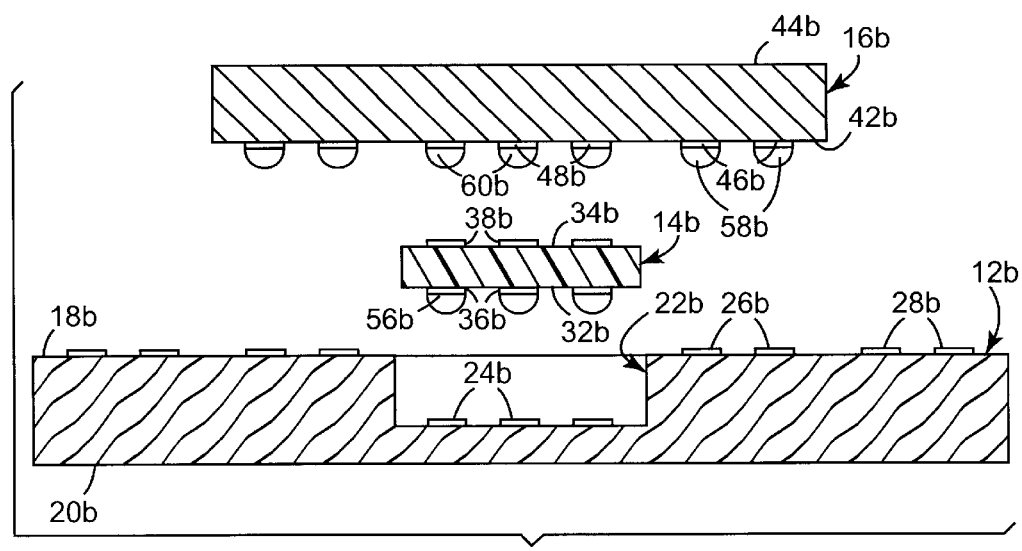
Figure 18C:
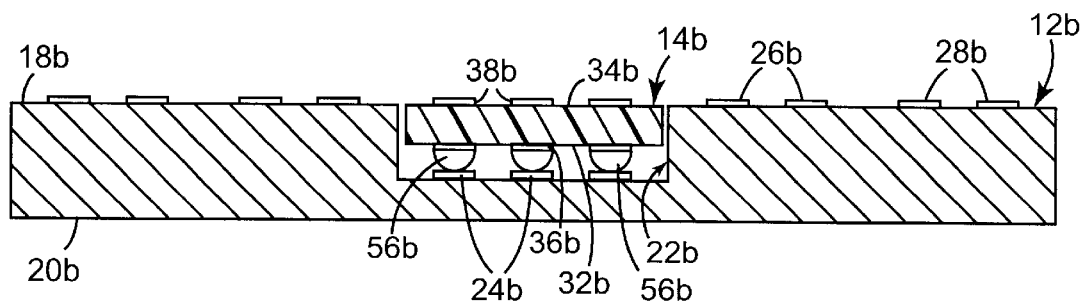
Figure 18D:
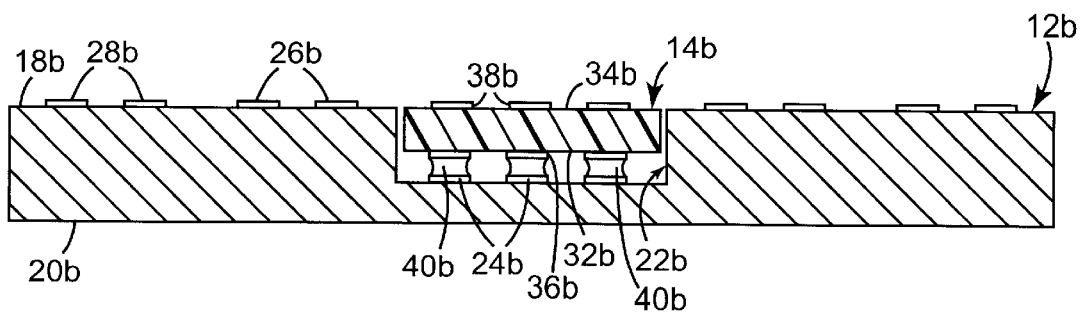
Figure 18E:
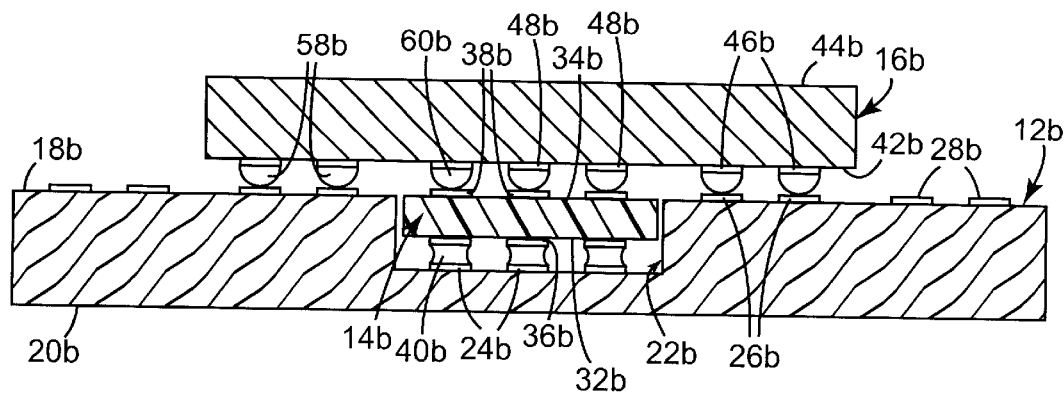
Figure 18F:
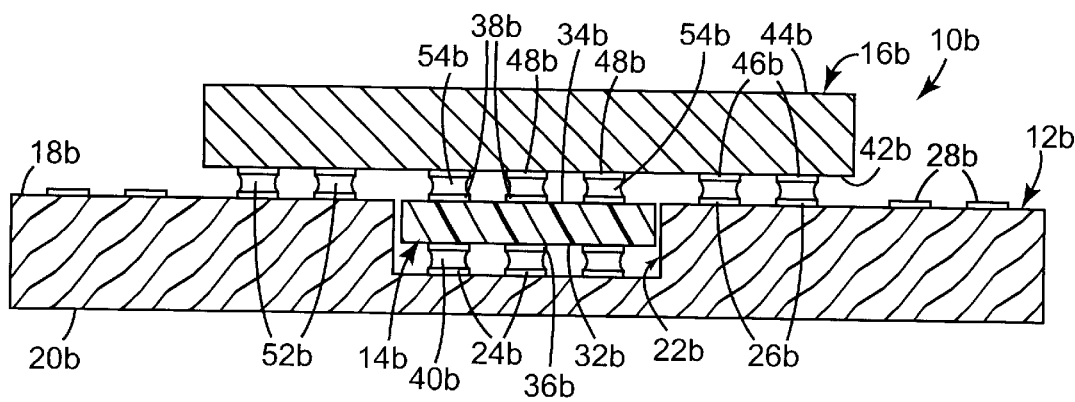

Assembly of the integrated circuit package 10b (shown in FIG. 15) in accordance with one alternative embodiment of the present invention is illustrated in FIGS. 18A–18F. The steps of FIGS. 18A and 18B are identical to FIGS. 16A and 16B. In FIG. 18C, the first IC die 14b has been positioned (i.e., engaged) in the recessed area 70b of the package substrate 12b such that the additional contact pads 36b (i.e., solder bumps 56b) are substantially aligned, with the further contact pads 24b. In FIG. 18D, sufficient heat is applied to the IC package 10b to reflow the solder bumps 56b to create the reflowed solder joints 40b thereby electrically connecting together the package substrate 12b and the first IC die 14b. In FIG. 18E, the second IC die 16b is been positioned (i.e., engaged) atop the package substrate 12b with the first IC die 14b positioned between the package substrate 12b and the second IC die 16b in the recessed area 70b. In this position, the first contact pads 46b (i.e., solder bumps 58b) of the second IC die 16b are substantially aligned with the first contact pads 26b of the package substrate 12b, and the second contact pads 48b (i.e., solder bumps 60b) of the second IC die 16b are substantially aligned with the contact pads 38b on the second surface 34b of the first IC die 14b. In FIG. 18F, sufficient heat is applied to the IC package 10b to simultaneously reflow the solder bumps 58b, 60b to simultaneously create the reflowed solder joints 52b, 54b thereby electrically connecting the second IC die 16b to the previously assemble package substrate 12b and first IC die 14b, thereby completing assembly of the IC package 10b.

This integrated circuit package 10, 10a, 10b assembled using flip-chip bonding techniques has low interconnect capacitance, thereby improving signal speed and substantially eliminating the need for off chip driver cells between the first and second IC dies. Moreover the assembly process of the integrated circuit package 10, 10a, 10b is amenable to high volume low defect manufacturing.

Although the present invention has been described with reference to preferred embodiments, workers skilled in the art will recognize that changes may be made in form and detail without departing from the spirit and scope of the invention.

What is claimed is:

1. An integrated circuit package comprising:
   a package substrate having a first surface including a first array of interconnection sites, and a second array of interconnection sites;

a first integrated circuit die having a first surface including an array of interconnection sites electrically connected to the second array of interconnection sites of the package substrate; and a second integrated circuit die having a first surface including an array of interconnection sites electrically connected to the first array of interconnection sites of the package substrate, wherein the first integrated circuit die is positioned amid the package substrate and the second integrated circuit die; wherein the first integrated circuit die has a second surface opposite the first surface, the second surface of the first integrated circuit die having an additional array of interconnection sites, wherein the first surface of the second integrated circuit die includes a further array of interconnection sites that is different than the array of interconnection sites of the first surface of the second integrated circuit die, and wherein the further array of interconnection sites of the second integrated circuit die is electrically connected to the additional array of interconnection sites on the second surface of the first integrated circuit die.

2. The integrated circuit package of claim 1 wherein the package substrate defines a recessed area sized to accommodate the first integrated circuit die, the recessed area including the second array of interconnection sites.

3. The integrated circuit package of claim 1 wherein the first array of interconnection sites of the package substrate is electrically connected to the array of interconnection sites of the second integrated circuit die by reflowed solder.

4. The integrated circuit package of claim 1 wherein the second array of interconnection sites of the package substrate is electrically connected to the array of interconnection sites of the first integrated circuit die by reflowed solder.

5. The integrated circuit package of claim 1 wherein gaps between the second integrated circuit die and the package substrate at the first array of interconnection sites of the package substrate and the array of interconnection sites of the second integrated circuit die are underfilled with epoxy.

6. The integrated circuit package of claim 5 wherein gaps between the first integrated circuit die and the package substrate at the array of interconnection sites of the first integrated circuit die and the second array of interconnection sites of the package substrate are underfilled with epoxy.

7. The integrated circuit package of claim 1 wherein the first array of interconnection sites of the package substrate is electrically connected to the array of interconnection sites on the first surface of the second integrated circuit die by reflowed solder, wherein the second array of interconnection sites of the package substrate is electrically connected to the array of interconnection sites on the first surface of the first integrated circuit die by reflowed solder, and wherein the further array of interconnection sites of the second integrated circuit die is electrically connected to the additional array of interconnection sites on the second surface of the first integrated circuit die by reflowed solder.

8. The integrated circuit package of claim 1 wherein the package substrate defines a recessed area sized to accommodate the first integrated circuit die, the recessed area including the second array of interconnection sites.

9. The integrated circuit package of claim 1 wherein the first surface of the package substrate includes an auxiliary array of interconnection sites that is different than the first and second arrays of interconnection sites of the package substrate.

10. The integrated circuit package of claim 1 wherein the first integrated circuit die is a memory die.

11. The integrated circuit package of claim 1 wherein the second integrated circuit die is a processor die.

* * * * *